United States Patent
Choi et al.

(10) Patent No.: US 10,002,992 B2
(45) Date of Patent: Jun. 19, 2018

(54) RED PHOSPHOR, WHITE LIGHT EMITTING DEVICE AND LIGHTING APPARATUS

(71) Applicant: SAMSUNG ELECTRONICS CO., LTD., Suwon-si (KR)

(72) Inventors: Sung Woo Choi, Suwon-si (KR); Jung Eun Yoon, Hwaseong-si (KR); Chul Soo Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days. days.

(21) Appl. No.: 15/226,314

(22) Filed: Aug. 2, 2016

(65) Prior Publication Data
US 2017/0040501 A1 Feb. 9, 2017

(30) Foreign Application Priority Data
Aug. 6, 2015 (KR) .................. 10-2015-0111297

(51) Int. Cl.
H01L 21/00 (2006.01)
H01L 33/50 (2010.01)
C09K 11/77 (2006.01)
C09K 11/08 (2006.01)
H01L 33/44 (2010.01)

(52) U.S. Cl.
CPC ........ H01L 33/502 (2013.01); C09K 11/0883 (2013.01); C09K 11/7734 (2013.01); H01L 33/44 (2013.01); H01L 33/501 (2013.01); H01L 33/504 (2013.01); H01L 2224/48091 (2013.01); H01L 2224/48247 (2013.01);
(Continued)

(58) Field of Classification Search
CPC .. H01L 33/502; H01L 33/504; C09K 11/0883
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

KR 10-2012-0063585 A 6/2012

OTHER PUBLICATIONS

"Toward New Phosphors for Application in Illumination-Grade White pc-LEDs: The Nitridomagnesosilicates Ca[Mg3SiN4]:Ce3+, Sr[Mg3SiN4]:Eu2+, and Eu[Mg3SiN4]" Schmiechen et al, Chem. Mater., 2014, 26 (8), pp. 2712-2719 DOI: 10.1021/cm500610v Publication Date (Web): Mar. 27, 2014.*
(Continued)

Primary Examiner — Laura Menz
(74) Attorney, Agent, or Firm — Sughrue Mion, PLLC

(57) ABSTRACT

A red phosphor contains a nitride having a formula of $Sr_xMg_ySi_zN_{2/3(x+y+2z+w)}:Eu_w$, in which x, y, z, and w satisfy the relationships $0.5 \leq x \leq 2$, $2.5 \leq y \leq 3.5$, $0.5 \leq z \leq 1.5$ and $0 < w \leq 0.1$. The red phosphor is configured to emit light having a peak wavelength in a range of from 610 nm to 625 nm when irradiated by an excitation source, and the excitation source may be a blue light source having a dominant wavelength in a range of 420 nm to 470 nm. In such a case, the spectrum of the emitted light has a full-width at half-maximum (FWHM) less than or equal to 55 nm.

3 Claims, 13 Drawing Sheets

(52) U.S. Cl.
CPC .............. *H01L 2224/48257* (2013.01); *H01L 2924/181* (2013.01); *Y02B 20/181* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,258,816 B2 * | 8/2007 | Tamaki | C01B 21/0602 252/301.4 F |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,058,793 B2 | 11/2011 | Tamaki et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,409,470 B2 | 4/2013 | Hirosaki et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,597,545 B1 | 12/2013 | Liu et al. | |
| 8,674,392 B2 | 3/2014 | Yoshimura et al. | |
| 8,735,931 B2 | 5/2014 | Han et al. | |
| 8,766,295 B2 | 7/2014 | Kim | |
| 8,906,262 B2 | 12/2014 | Tian et al. | |
| 8,951,441 B2 | 2/2015 | Li et al. | |
| 8,992,797 B2 | 3/2015 | Seto et al. | |
| 9,546,319 B2 * | 1/2017 | Schmidt | C09K 11/0883 |
| 2003/0020101 A1 | 1/2003 | Bogner et al. | |
| 2004/0061433 A1 * | 4/2004 | Izuno | H01L 21/76251 313/498 |
| 2006/0231852 A1 * | 10/2006 | Kususe | H01L 24/06 257/99 |
| 2013/0075692 A1 | 3/2013 | Naasani et al. | |

OTHER PUBLICATIONS

Luminescence of the Narrow-Band Red Emitting Nitridomagnesosilicate Li2(Ca1—xSrx)2[Mg2Si2N6]:Eu2+(x=0-0.06), Strobel et al , Chem. Mater., 2017, 29 (3), pp. 1377-1383 DOI: 10.1021/acs.chemmater.6b05196 Publication Date (Web): Jan. 13, 2017.*

Sebastian Schmiechen et al.,"Toward New Phosphors for Application in Illumination-Grade White pc-LEDs: The Nitridomagnesosilicates $Ca[Mg_3SiN_4]:Ce^{3+}$, $Sr[Mg_3SiN_4]:Eu^{2+}$, and $Eu[Mg_3SiN_4]$", Chemistry of Materials, 2014, pubs.acs.org/cm 8 Pages Total dx.doi.org/10.1021/cm500610v.

Philipp Pust et al., "Narrow-band red-emitting $Sr[LiAl_3N_4]:Eu^{2+}$ as a next-generation LED-phosphor material", Nature Materials, (2014), Macmillan Publishers Limited 6 Pages Total DOI: 10.1038/NMAT4012.

* cited by examiner

RED PHOSPHOR, WHITE LIGHT EMITTING DEVICE AND LIGHTING APPARATUS

CROSS-REFERENCE TO RELATED APPLICATION

This application claims benefit to Korean Patent Application No. 10-2015-0111297 filed on Aug. 6, 2015, with the Korean Intellectual Property Office, the entire disclosure of which is incorporated herein by reference.

BACKGROUND

The present disclosure relates to a red phosphor, a white light emitting device and a lighting apparatus including the same.

In general, wavelength converting phosphors are used as materials for converting light having particular wavelengths emitted by various light sources into light having more desirable wavelengths. Particularly, light emitting diodes (LEDs), among other various types of light sources, may be advantageously applied to liquid crystal display (LCD) backlights, automobile headlamps and tail lights, home lighting apparatuses and the like, because of their low power consumption and excellent optical efficiency characteristics thereof. As a result, phosphor materials have recently been in the spotlight as a core technology in manufacturing white light emitting devices.

White light emitting devices are generally manufactured by applying at least one kind of phosphor (e.g., yellow, red, or blue) to blue or ultraviolet LED chips. Such a phosphor requires superior reliability even in a high-temperature, high-humidity environments, and must also possess high light emitting characteristics.

SUMMARY

An aspect of the present disclosure provides a red phosphor having improved luminous efficacy of radiation (LER), and a white light emitting device and a lighting apparatus having improved optical characteristics, such as improved color rendering index (CRI), using the same.

According to an exemplary embodiment, a red phosphor may contain a nitride of the formula $Sr_xMg_ySi_zN_{2/3(x+y+2z+w)}:Eu_w$, in which x, y, z, and w satisfy the following: $0.5 \leq x \leq 2$, $2.5 \leq y \leq 3.5$, $0.5 \leq z \leq 1.5$ and $0 < w \leq 0.1$.

The red phosphor may be configured to emit light having a peak wavelength in the range of 610 nm to 625 nm when irradiated by an excitation source, and the excitation source may be a blue light source having a dominant wavelength in the range of 420 nm to 470 nm. In this case, the spectrum of the emitted light may have a full-width at half-maximum (FWHM) less than or equal to 55 nm.

In an embodiment of the present disclosure, y may be 3 and z may be 1, and x and w may satisfy the relationships $x+w=1$, $0.95 < x < 1$ and $0 < w < 0.05$.

The red phosphor may have a content of oxygen less than or equal to 1 wt % as an impurity.

According to an exemplary embodiment, the red phosphor may contain a nitride having a composition of $Sr_{1-a}Mg_3SiN_4:Eu_a$, in which a may satisfy the relationship $0 < a < 0.05$. The red phosphor may be configured to emit light having a peak wavelength in the range of 610 nm to 625 nm when irradiated by an excitation source. A spectrum of the emitted light may have a FWHM less than or equal to 55 nm.

An amount of light having a wavelength longer than or equal to 680 nm in the spectrum of the emitted light may be less than or equal to 5% of the total amount of light.

According to an exemplary embodiment, a white light emitting device may include a semiconductor light emitting device emitting light having a dominant wavelength in the range of 420 nm to 470 nm, a red phosphor disposed around the semiconductor light emitting device to convert the wavelength of at least a portion of the emitted light into that of red light, and at least one light source element emitting light having a wavelength different from the wavelength of light emitted by the semiconductor light emitting device and from the wavelength of the red light. The at least one light source element may be, e.g., at least one of another semiconductor light emitting device or another phosphor. The red phosphor may contain a nitride having a composition of $Sr_xMg_ySi_zN_{2/3(x+y+2z+w)}:Eu_w$, in which x, y, z, and w satisfy $0.5 \leq x \leq 2$, $2.5 \leq y \leq 3.5$, $0.5 \leq z \leq 1.5$ and $0 < w \leq 0.1$.

According to an exemplary embodiment, a method of producing a red phosphor is provided. The red phosphor may contain a nitride of the formula $Sr_xMg_ySi_zN_{2/3(x+y+2z+w)}:Eu_w$, in which x, y, z, and w satisfy the relationships $0.5 \leq x \leq 2$, $2.5 \leq y \leq 3.5$, $0.5 \leq z \leq 1.5$ and $0 < w \leq 0.1$. The method includes: measuring raw material powders incorporating an Sr-containing compound, an Mg-containing nitride, an Si-containing nitride and an Eu-containing compound; mixing the raw material powders to prepare a mixed powder; and sintering the mixed powder to obtain the red phosphor.

The raw material powders may contain $Sr_3N_2$, $Mg_3N_2$, $Si_3N_4$ and EuN. In this case, the preparation of the mixed powder may be performed in an enclosed space filled with an inert gas. For example, the sintering of the mixed powder may be performed at a temperature ranging from 1400° C. to 1700° C.

The method of producing a red phosphor may further include: pulverizing the red phosphor to form particles having a desired particle size; and cleaning the particles of the red phosphor.

According to an exemplary embodiment, a lighting apparatus using the aforementioned red phosphor as a wavelength conversion material is provided.

The lighting apparatus may include: a light emitting diode (LED) light source module and a diffusion sheet disposed on the LED light source module and uniformly diffusing light received from the LED light source module. The LED light source module may include a circuit board and a white light emitting device disposed on the circuit board which includes the aforementioned red phosphor as a wavelength conversion material.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
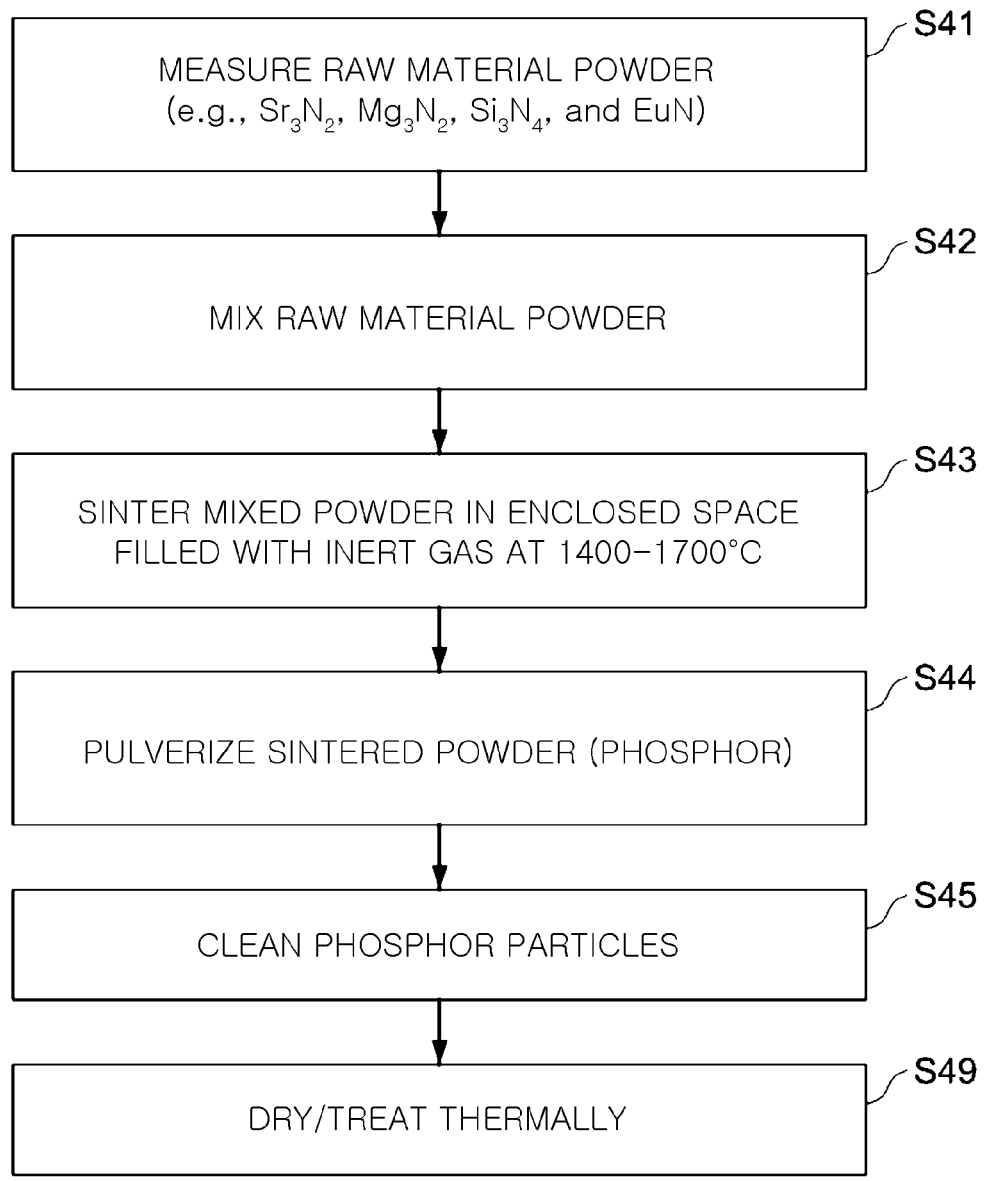
FIG. 1 is a flow chart illustrating a method of producing a red phosphor according to an exemplary embodiment of the present inventive concept.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating various embodiments. In the drawings, for example, due to manufacturing techniques and/or tolerances, modifications of the shape shown may be made. Thus, embodiments of the present disclosure should not be construed as being limited to the particular shapes of regions shown herein and may, for example, to include a change in shape results in manufacturing. The following embodiments may also be combined.

The contents described below may have a variety of configurations. Set forth herein are exemplary configurations, but the present disclosure is not limited thereto.

The term "an exemplary embodiment" used throughout this specification does not refer to the same example embodiment, and the term is provided to emphasize a particular feature or characteristic different from another exemplary embodiment. However, exemplary embodiments provided hereinafter may be implemented in combination, in whole or in part, with one with another. For example, one element described in the context of a particular embodiment, even if it is not described in another exemplary embodiment, may be understood as having been described, as may be applicable, to another exemplary embodiment, unless an opposite or contradictory description is provided therein.

Red Phosphor

According to an exemplary embodiment of the present disclosure, a red phosphor may contain a nitride of the formula $Sr_xMg_ySi_zN_{2/3(x+y+2z+w)}:Eu_w$, in which x, y, z, and w satisfy the relationships $0.5 \leq x \leq 2$, $2.5 \leq y \leq 3.5$, $0.5 \leq z \leq 1.5$ and $0 < w \leq 0.1$.

The red phosphor may be configured to emit light having a peak wavelength in the range of 610 nm to 625 nm when irradiated by an excitation source.

The excitation source may be a blue light source having a dominant wavelength in the range of 420 nm to 470 nm.

The red phosphor may have narrow full-width at half-maximum (FWHM) characteristics. A spectrum of light emitted by the excitation source may have an FWHM less than or equal to 55 nm.

As such, the red phosphor according to an exemplary embodiment of the present disclosure may significantly reduce the amount of light that is emitted in a wavelength region outside of the visible wavelength region, as a result of having narrow FWHM characteristics and short wavelength characteristics within the red wavelength band. For example, the amount of lost light (i.e., light having a wavelength greater than or equal to 680 nm) in the region outside of the visibility curve may be reduced to less than 5%, and in preferred embodiments to less than 1%.

According to a certain embodiment, the content (y) of magnesium is 3, the content (z) of silicon is 1, and the content (x) of strontium and the content (w) of europium satisfy the relationship x+w=1, 0.95<x<1, and 0<w<0.05.

The red phosphor may have a content of oxygen less than or equal to 1 wt % as an impurity. The red phosphor may be a nitride phosphor, but may include oxygen as an impurity. The oxygen may form a non-light emitting level within a band gap, and electrons excited as a result of the non-light emitting level may become phonons, rather than photons, such that the energy of the electrons may be lost. As a result, the efficiency and reliability of the red phosphor may be reduced.

However, the content of oxygen may be controlled to be below a predetermined level (e.g., 1 wt % or less) so as to inhibit a non-light emitting level from being formed as a result of the presence of the oxygen. Consequently, deterioration of the red phosphor may be prevented even within a high-temperature, high-humidity package environment, while achieving a high level of brightness. Controlling the oxygen concentration may be done by suppressing formation of an oxide during the process of one of the embodiments herein, and this will be described in more detail with reference to FIG. 1.

Method of Producing Red Phosphor

FIG. 1 is a flow chart illustrating a method of producing a red phosphor according to an exemplary embodiment of the present disclosure.

First, in order to produce a red phosphor having of the formula $Sr_xMg_ySi_zN_{2/3(x+y+2z+w)}:Eu_w$ (here, 0.5≤x≤2, 2.5≤y≤3.5, 0.5≤z≤1.5 and 0<w≤0.1), raw material powders incorporating an Sr-containing compound, an Mg-containing nitride, an Si-containing nitride and an Eu-containing compound are measured (S41).

To lower the oxygen concentration present in the final red phosphor, each of the raw material powders may have an oxygen concentration of less than 1 wt %. For example, the raw material powders may include $Sr_3N_2$, $Mg_3N_2$, $Si_3N_4$ and EuN.

Then, a mixed powder may be prepared by mixing the raw material powders (S42), and the mixed powder may be sintered to obtain a desired red phosphor (S43).

The preparing of the mixed powder may be performed in an enclosed space filled with an inert gas, such as an argon (Ar) gas. The mixing process may effectively prevent the raw material powders from contacting oxygen.

Gas pressure sintering (GPS) may be used in the sintering process. The sintering process including the mixed powder may be performed under a nitrogen gas atmosphere or under a hydrogen/nitrogen mixed gas atmosphere at a temperature of, e.g., 1400° C. to 1700° C. Pressure conditions may range from 5 bars to 10 bars.

The sintering process may include the application of the mixed powder to a metallic or ceramic crucible. Here, a metallic crucible may significantly suppress the generation of impurities, such as oxides, even when a high temperature sintering process is undertaken therein, unlike a conventional boron nitride (BN) ceramic crucible. Thus, the concentration of oxygen, an impurity, in the final red phosphor, may be maintained at a level less than or equal to 1 wt % (preferably, less than or equal to 0.5 wt %). After completing the sintering process, the mixed powder may be slowly cooled to 600° C. for 60-100 hours.

Then, the sintered powder may be pulverized such that a red phosphor powder having a desired particle size may be obtained (S44). In this process, a step of pulverizing the sintered powder, i.e., the synthesized red phosphor, using a ball milling process or the like may be performed such that the sintered powder has a desired particle size. The pulverizing process may control the particle size of the phosphor powder. For example, the particle size of the phosphor powder may be controlled to be 5 μm≤d50≤30 μm. The pulverizing process may also be omitted when the sintered powder satisfies a desired particle size range.

The phosphor powder may be cleaned (S45). For example, a cleaning process may be performed to remove impurities or fine particles from the surfaces of the phosphor powder particles, including those having a controlled particle size. An acidic or basic solution may be used in the cleaning process. For example, a hydrofluoric acid solution and/or an acetone solution may be used as a cleaning solution to perform the cleaning process. If necessary, the cleaning process may be performed repeatedly, using different solutions.

A red nitride phosphor according to an exemplary embodiment of the present disclosure may be obtained by drying the cleaned nitride particles (S49). A process of thermally treating the nitride particles at a temperature of, e.g., 100° C. to 150° C. may be selectively performed after drying the nitride particles.

If necessary, the cleaned phosphor powder may be additionally heat treated under conditions similar to the sintering conditions. The heat treatment process may remove defects from the red nitride phosphor, thereby improving the crystallinity thereof. Improving the crystallinity of the red nitride phosphor may increase its efficiency. The temperature of the heat treatment process may be greater than or equal to that of the sintering process. The time required for the heat treatment process may be longer or equal to that required for the sintering process.

Evaluation of Red Phosphor

A nitride phosphor was produced by using $Sr_3N_2$, $Mg_3N_2$, $Si_3N_4$ and EuN as raw material powders. In particular, first, the raw material powders were measured for preparation and the prepared raw material powders were mixed with ethanol using a ball mill. The ethanol was evaporated by drying the raw material mixture with a dryer. Then, the dried raw material mixture was inserted into a metallic (e.g., tungsten) crucible. The metallic crucible filled with the raw material mixture was inserted into a heating furnace, and the raw material mixture was sintered at a temperature of 1550° C. under a nitrogen gas atmosphere. The sintered phosphor was cleaned.

Figure 2:
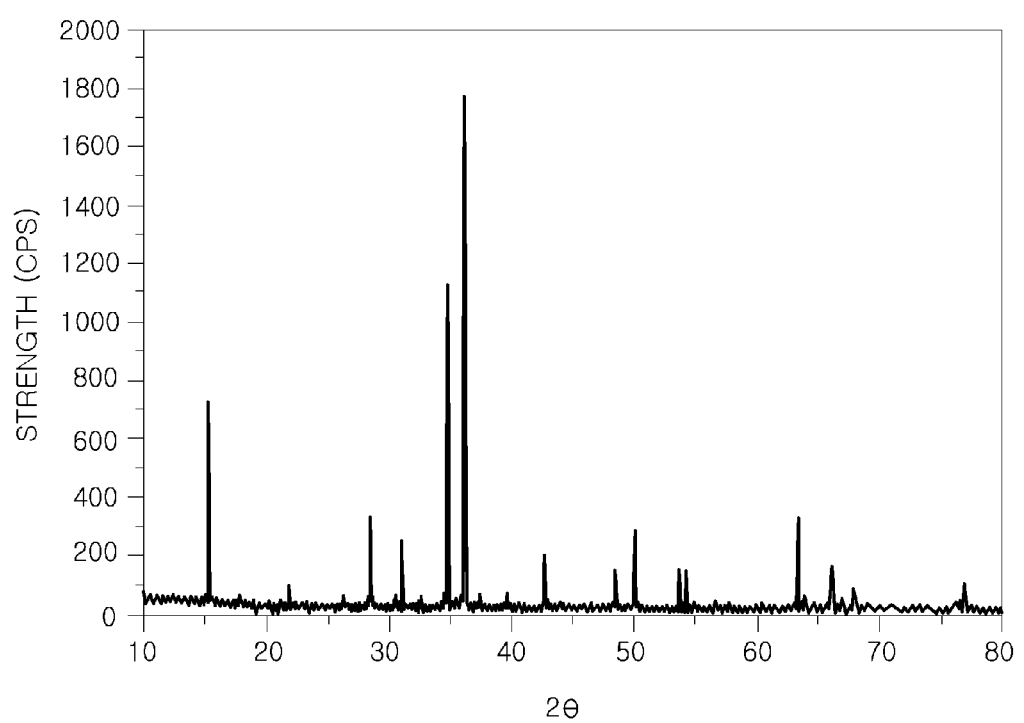
FIG. 2 is a graph illustrating an X-ray diffraction (XRD) analysis result according to Example 1.

It was confirmed that the resulting sintered phosphor was a nitride phosphor containing each of Sr, Eu, Mg, Si, and N and had a composition of $Sr_{0.98}Eu_{0.02}Mg_3SiN_4$ (Example 1). As illustrated in FIG. 2, an XRD analysis result exhibited that the crystal structure of the nitride phosphor was a tetragonal system structure in which the lattice parameters satisfied the following: a=b=11.5310 Å, c=13.5425 Å, and α, βγ=90°.

In order to measure the light emitted from the obtained nitride phosphor, the nitride phosphor was irradiated with light having a wavelength of about 450 nm from a blue light emitting diode (LED) chip.

In Comparative Examples 1 and 2, different red nitride phosphors, (Sr, Ca) $AlSiN_3:Eu^{2+}$ and $(Sr, Ba)_2Si_5N_8:Eu^{2+}$, were irradiated by an identical LED chip to measure the light emitted from the different red nitride phosphors in the same manner. Spectra of the emitted light according to Example 1 and Comparative Examples 1 and 2 are illustrated in FIG.

3, and respective peak wavelengths and full-widths at half-maximum (FWHMs) of the emitted light are shown in Table 1 below.

TABLE 1

| Example | Peak Wavelength (nm) | Full-Width at Half-Maximum (nm) |
|---|---|---|
| Example 1 | 615 | 46 |
| Comparative Example 1 | 625 | 82 |
| Comparative Example 2 | 625 | 80 |

Figure 3:
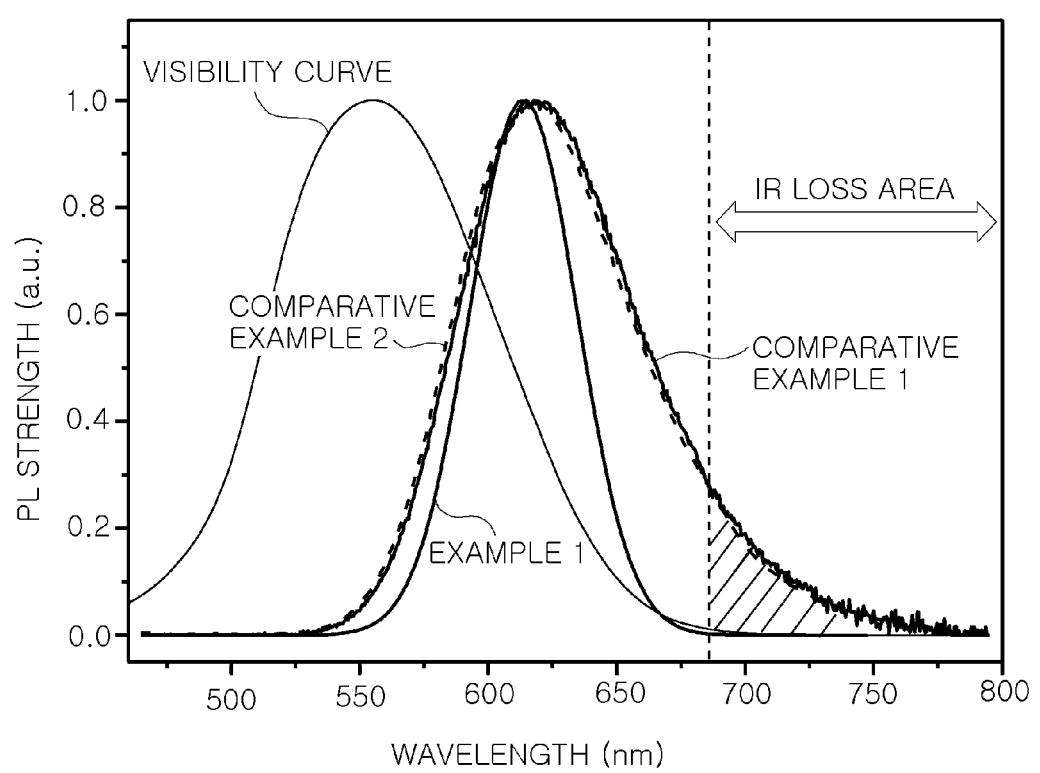
FIG. 3 is a graph illustrating the light emitting spectrum of a red phosphor according to Example 1, Comparative Example 1, and Comparative Example 2.

As shown in Table 1 and FIG. 3, in Comparative Examples 1 and 2, since the emitted light had a relatively wide FWHM despite having a relatively short peak wavelength in the red region, the infrared (IR) light loss region outside of the visibility curve accounted for 10% of the total regions. On the other hand, it was confirmed that the red phosphor according to Example 1 had almost no IR loss region outside of the visibility curve since the red phosphor had a narrow FWHM of 46 nm while having a peak wavelength in a relatively short wavelength band.

Figure 4:
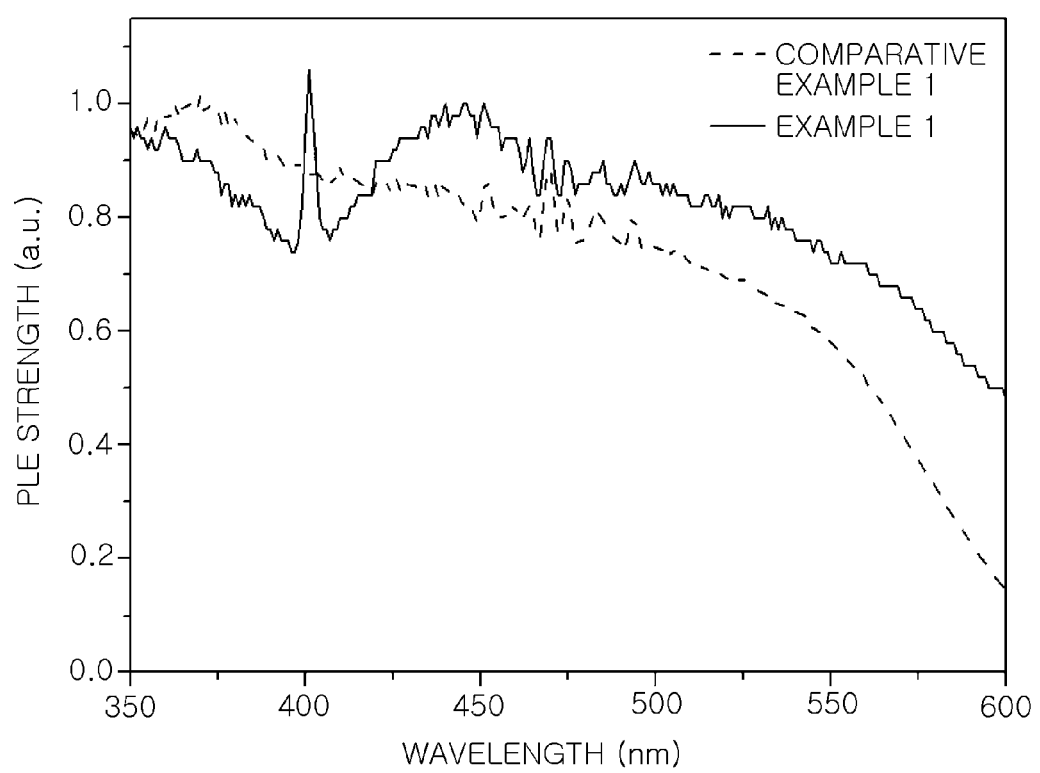
FIG. 4 is a graph illustrating the spectrum of excitation light from a red phosphor according to Example 1 and Comparative Example 1.

Excitation spectra of Example 1 and Comparative Example 1 were analyzed. The results are displayed in FIG. 4 and Table 2. As can be seen in FIG. 4 and Table 2, it was confirmed that the red phosphor according to Example 1 exhibited a relatively higher level of photoluminescence excitation (PLE) strength around a wavelength of 450 nm while the red phosphor according to Comparative Example 1 had higher efficiency around a wavelength lower than that of 450 nm, for example, around the wavelength of infrared light.

TABLE 2

| | Relative Excitation Strength | | | | |
|---|---|---|---|---|---|
| | 350 nm | 400 nm | 450 nm | 500 nm | 550 nm |
| Example 1 | 96% | 82% | 100% | 86% | 72% |
| Comparative Example 1 | 95% | 88% | 80% | 75% | 58% |

As such, it can be seen that the red phosphor according to Example 1 may be effective and suitably used in a blue LED having a wavelength of 450 nm.

Improvements in the Application of a White Light Emitting Device

A simulation was carried out to confirm improvements in a white light emitting device according to peak wavelengths and full-widths at half-maximum (FWHMs) of light from a red phosphor. Brightness, a color rendering index (CRI), and a red characteristic (R9) according to peak wavelengths and FWHMs of light from a red phosphor were measured under conditions in which the wavelength of light from an excitation source was set to 450 nm and a peak wavelength and an FWHM of light from a green phosphor were set as 530 nm and 100 nm, respectively. The results are shown in FIGS. 5A through 5C.

Figure 5A:
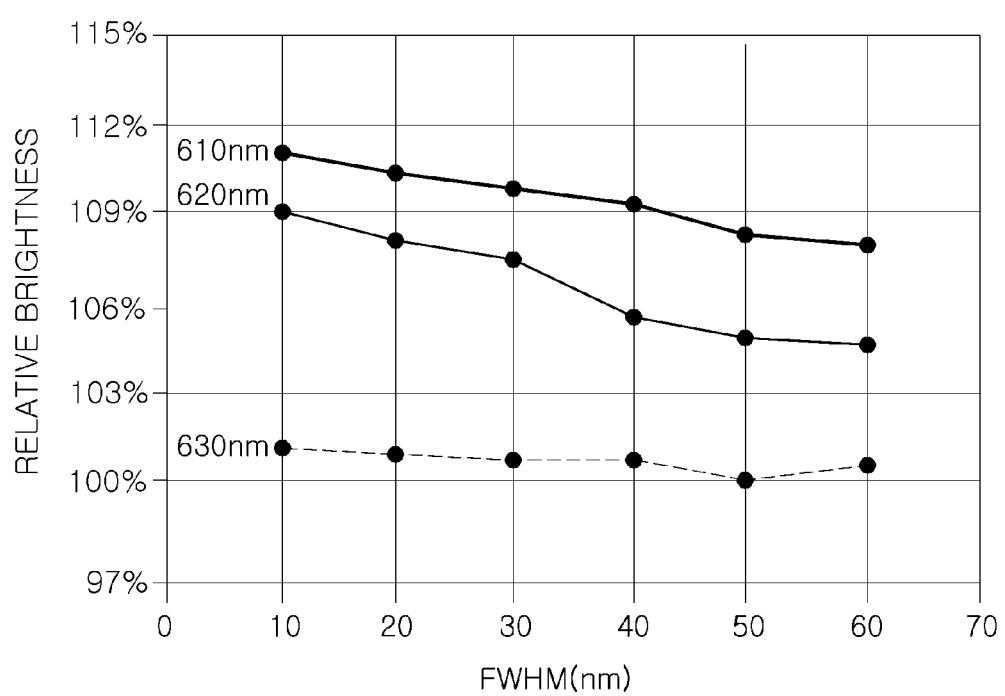
FIGS. 5A, 5B and 5C are graphs illustrating optical characteristics of a white light emitting device according to the conditions (peak wavelength and full-width at half-maximum (FWHM)) of a red phosphor.
Figure 5B:
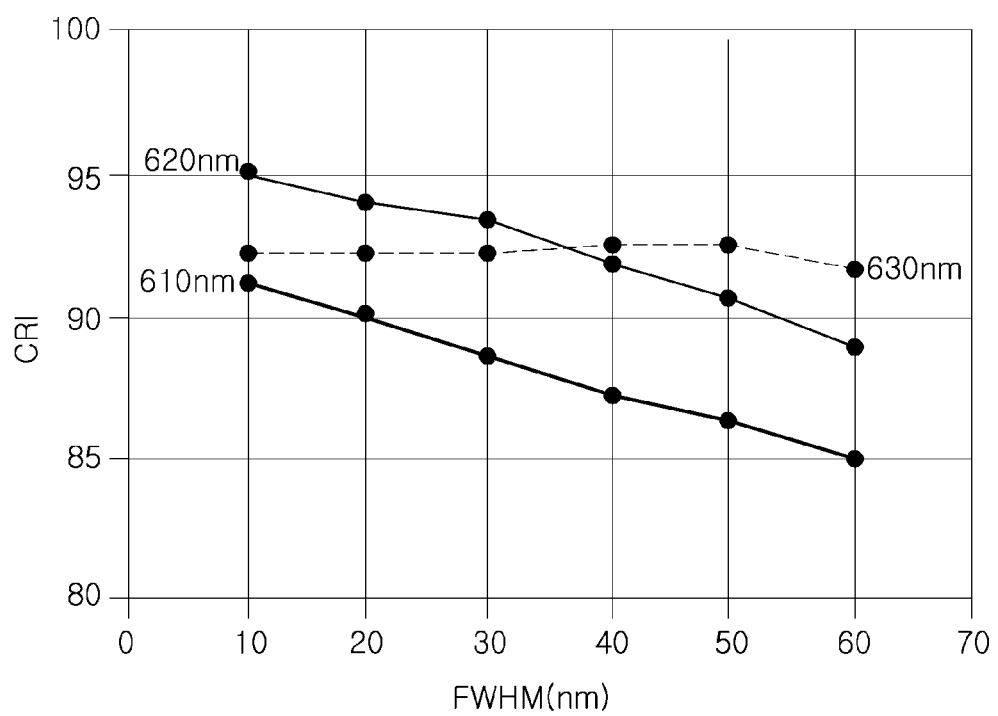
Figure 5C:
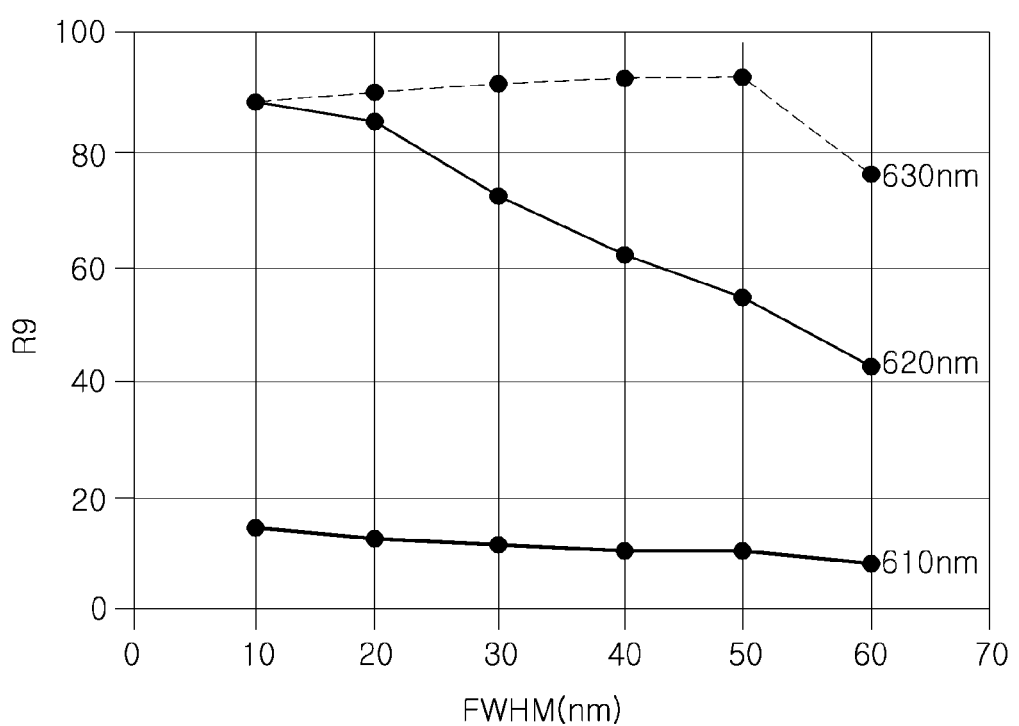

Referring to FIG. 5A, it was confirmed that brightness was relatively low when the peak wavelength of light from the red phosphor was 630 nm, and that brightness was relatively high in a different peak wavelength (610 nm or 620 nm) while as the width of the FWHM of the light from the red phosphor increased, the relative brightness of the red phosphor generally decreased. Referring to FIGS. 5B and 5C, it was seen that CRI and R9 were relatively high in the peak wavelengths of 620 nm or 630 nm, as compared to in a peak wavelength of 610 nm. For example, it was confirmed that the lower the FWHM of the light from the red phosphor, the better the characteristics of the red phosphor were when the light from the red phosphor had the peak wavelength of 620 nm. As such, the peak wavelength as well as the FWHM may be an important factor for characteristics improvements. For example, it was confirmed that, even when the FWHM was narrow, desired characteristics (especially brightness, CRI) could not be obtained at a relatively long peak wavelength of 630 nm.

Taken as a whole, it was confirmed that a desirable peak wavelength of light from the red phosphor ranged from 615 nm to 625 nm to obtain superior characteristics (e.g., brightness or CRI) in the white light emitting device.

Composition Ratio of Red Phosphor

Conditions of Strontium (Sr) Content (x)

Using $Sr_3N_2$, $Mg_3N_2$, $Si_3N_4$ and EuN as raw material powders, a nitride phosphor having a composition of $Sr_xMg_ySi_zN_{2(x+y+2z)/3}:Eu_w$, was produced, and red phosphors (samples C1 to C4) satisfying the compositions shown in Table 3 below were manufactured. In particular, first, the raw material powders were measured and mixed. The mixed raw material powders were inserted into a metallic crucible. The metallic crucible was inserted into a heating furnace such that the mixed raw material powders were sintered at a temperature of 1550° C. under a nitrogen gas atmosphere. The sintered phosphor was cleaned.

Figure 6:
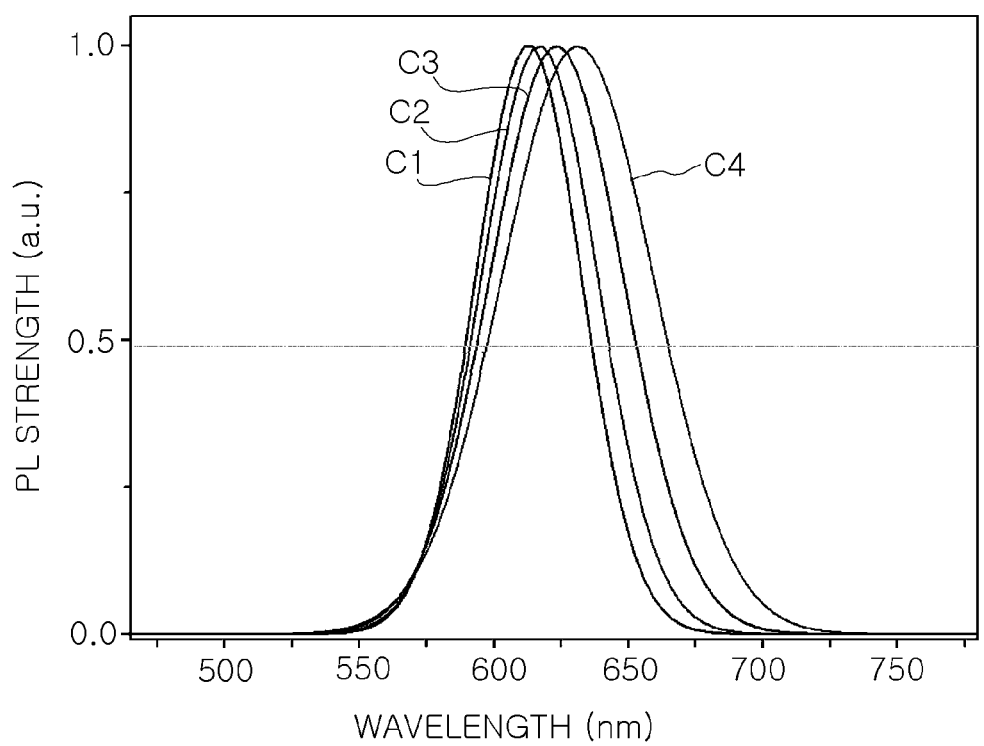
FIG. 6 is a graph illustrating the peak wavelength and FWHM of light emitted from a red nitride phosphor according to changes in composition ratios.

Peak wavelengths and full-widths at half-maximum (FWHMs) of light from the red phosphors according to the respective samples C1-C4 were measured, and the results are shown in the graph of FIG. 6 and are depicted in Table 3. The red phosphor compositions in FIG. 6 and Table 3 may be represented by $Sr_{1-a}Mg_3SiN_4:Eu_a$.

TABLE 3

| Sample | Sr content (1-a) | Mg content | Eu content (a) | Peak Wavelength (nm) | FWHM (nm) |
|---|---|---|---|---|---|
| Sample C1 | 0.99 | 3.00 | 0.01 | 613 | 41 |
| Sample C2 | 0.98 | 3.00 | 0.02 | 615 | 46 |
| Sample C3 | 0.97 | 3.00 | 0.03 | 623 | 54 |
| Sample C4 | 0.95 | 3.00 | 0.05 | 631 | 62 |

As seen in Table 3, as illustrated in FIG. 6, light from the red phosphors according to samples C1-C4 had a generally narrow FWHM, and a relatively short peak wavelength. For instance, light from the red phosphors according to samples C1-C3 maintained a peak wavelength less than or equal to 625 nm, and had an FWHM less than or equal to 55 nm. Under such conditions, the region outside of the visibility curve, i.e., the amount of area under the emitted light wavelength curve that is outside of the visibility curve (referring to FIG. 3), may be less than or equal to 5% of the total area under the emitted light wavelength curve, or may be less than or equal to 1%, or may be almost non-existent.

White Light Emitting Device including Red Phosphor

Figure 7:
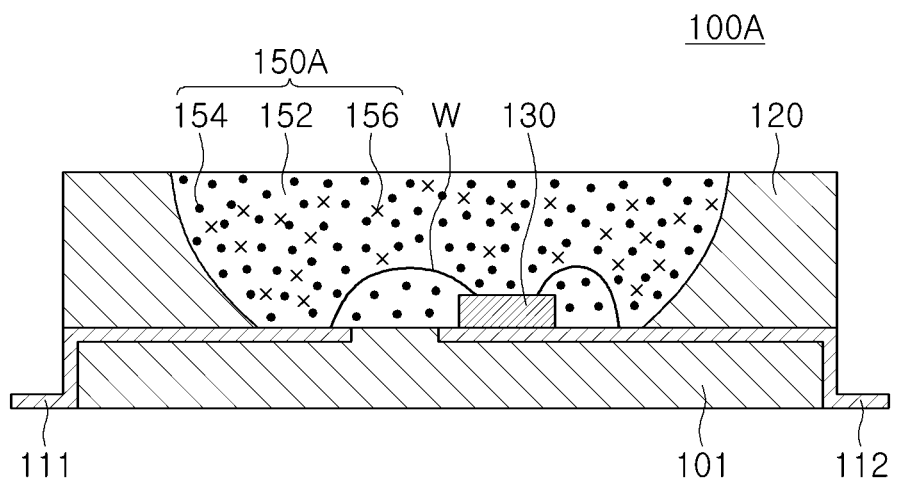
FIGS. 7 and 8 are schematic cross-sectional views respectively illustrating white light emitting devices according to various exemplary embodiments of the present disclosure.
Figure 8:
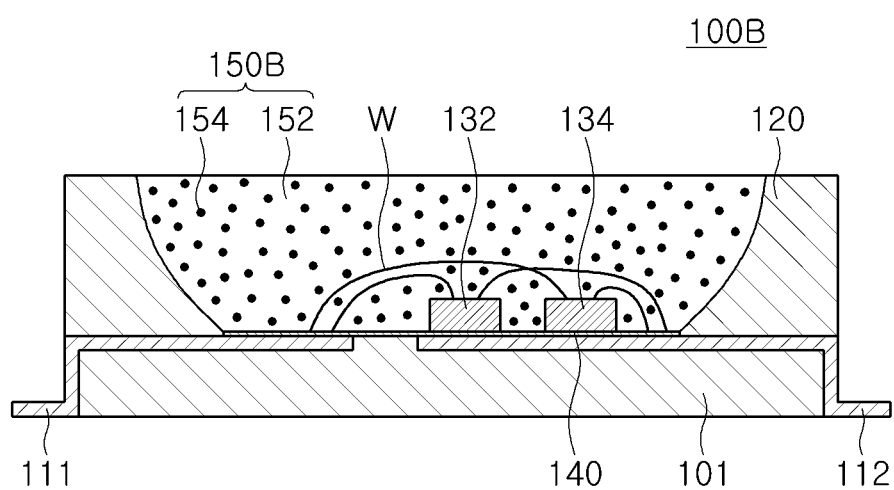

The red nitride phosphor according to exemplary embodiments of the present disclosure may be advantageously applied to various types of white light emitting devices. FIGS. 7 and 8 are schematic cross-sectional views respectively illustrating white light emitting devices according to various exemplary embodiments of the present disclosure.

FIG. 7 is a schematic cross-sectional view of a light emitting device according to an exemplary embodiment of the present disclosure.

Referring to FIG. 7, a white light emitting device 100A may include a package substrate 101, a semiconductor light emitting device 130 disposed on the package substrate 101, and a wavelength conversion member 150A. In addition, the white light emitting device 100A may include a pair of lead frames 111 and 112 electrically connected to the semiconductor light emitting device 130, a body portion 120 having a cup shape, and a conductive wire W connecting the semiconductor light emitting device 130 to the lead frames 111 and 112.

The package substrate 101 may be formed from an opaque resin or a resin having a high reflectivity, or may include a polymer resin, which facilitates injection molding. In addition, the package substrate 101 may include a ceramic. In such a case, heat may be easily dissipated. According to an exemplary embodiment of the present disclosure, the package substrate 101 may be a printed circuit board (PCB) with a wiring pattern formed thereon.

A reflecting side wall portion 120 may be disposed on the package substrate 101 and the lead frames 111 and 112 to form a cavity for receiving the semiconductor light emitting device 130. The reflecting side wall portion 120 may have a cup shape such that light reflection efficiency may be increased, but is not limited thereto. According to an exemplary embodiment of the present disclosure, the reflecting side wall portion 120 may be integrated with the package substrate 101 to form a package body.

The semiconductor light emitting device 130 may be disposed on an upper surface of the package substrate 101, and may include an epitaxially grown semiconductor layer. The semiconductor light emitting device 130 may emit blue light, for example, light having a dominant wavelength ranging from 420 nm to 470 nm.

The wavelength conversion member 150A may be disposed in the cavity surrounded by the reflecting side wall portion 120, and may include an encapsulating layer 152, a red phosphor 154 and a green phosphor 156 scattered in the encapsulating layer 152. The red phosphor 154 may be a nitride phosphor according to one of the exemplary embodiments described above. The wavelength conversion member 150A may create wavelength-converted visible light from excitation light emitted by the semiconductor light emitting device 130. For example, the red phosphor 154 and the green phosphor 156 may be excited by blue light emitted by the semiconductor light emitting device 130 to emit red light and green light, respectively. The encapsulating layer 152 may include a light transmitting resin such as an epoxy, a silicone, a strained silicone, a urethane resin, an oxetane resin, an acrylic, a polycarbonate, a polyimide, and combinations thereof.

FIG. 8 is a schematic cross-sectional view of a white light emitting device according to an example embodiment of the present inventive concept.

Referring to FIG. 8, a white light emitting device 100B may include a substrate 101, a first semiconductor light emitting device 132 and a second semiconductor light emitting device 134 disposed on the substrate 101, a passivation layer 140, and a wavelength conversion member 150B. The first and second semiconductor light emitting devices 132 and 134 may be connected to lead frames 111 and 112 by a conductive wire W.

The first and second semiconductor light emitting devices 132 and 134 may emit light having different wavelengths. For example, the first semiconductor light emitting device 132 may emit green light, and the second semiconductor light emitting device 134 may emit blue light. The wavelength conversion member 150B may include an encapsulating layer 152 and only a red phosphor 154 according to one of the example embodiments.

The passivation layer 140 may be disposed on at least one surface of the wavelength conversion member 150B. The passivation layer 140 may include a hydrophobic material able to prevent water penetration. The passivation layer 140 may protect the red phosphor 154 from external environmental conditions, for example, moisture, to ensure reliability of the white light emitting device 100B. For example, the passivation layer 140 may include resin materials, such as an epoxy, a silicone, a strained silicone, a urethane resin, an oxetane resin, an acrylic, a polycarbonate, and a polyimide. In this case, the refractive index of the passivation layer 140 may be different from that of the encapsulating layer 152 whereby light extraction efficiency may be increased. Alternatively, the passivation layer 140 may be a coating layer including fluorine- and silica-based coatings.

According to the exemplary embodiment of the present disclosure, the passivation layer 140 may be disposed on a lower surface of the wavelength conversion member 150B, i.e., the space between the wavelength conversion member 150B and the substrate 101. However, the arrangement of the passivation layer 140 may be varied according to exemplary embodiments of the present disclosure. For example, the passivation layer 140 may be disposed on all of an upper surface and the lower surface of the wavelength conversion member 150B, or may be disposed so as to surround the overall wavelength conversion member 150B.

Figure 9:
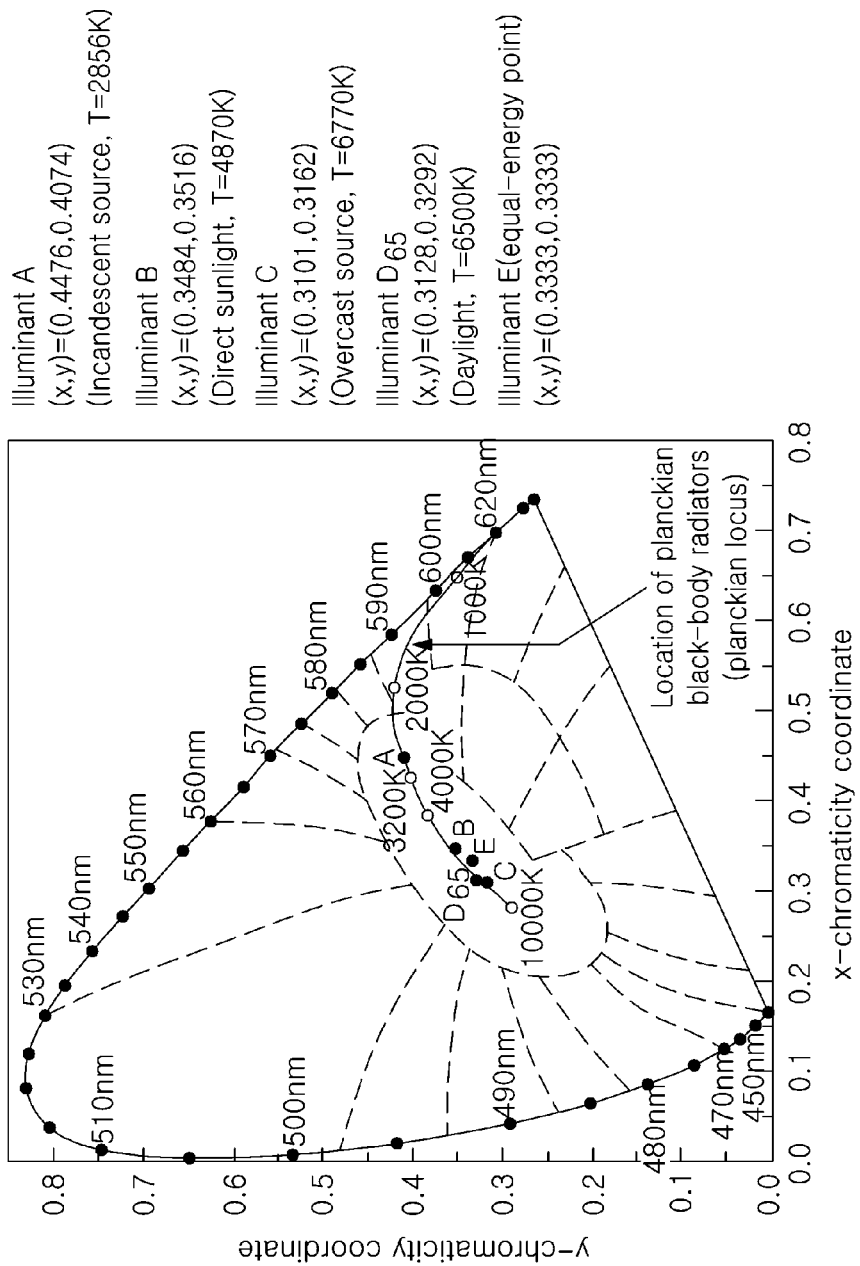
FIG. 9 is a CIE 1931 color space diagram to illustrate the position of the wavelength conversion material employable in a white light emitting device according to an exemplary embodiment of the present disclosure.

FIG. 9 is a CIE 1931 color space diagram illustrating the position of wavelength conversion material employable in a white light emitting device according to an exemplary embodiment of the present disclosure.

When the semiconductor light emitting devices 130, 132, and 134 of FIGS. 7 and 8 emit blue light, the light emitting devices 100A and 100B including at least one of yellow (or orange), green or red phosphors may have a phosphor mixture ratio thereof adjusted to emit white light having various color temperatures. For example, combining the red phosphor with the green phosphor, or the yellow or orange phosphor with the green and/or red phosphor may allow for the color temperature and the color rendering index (CRI) of white light to be controlled.

White light generated by combinations of a blue light emitting device with yellow (or orange), green, red phosphors and/or green and red light emitting devices may have at least two peak wavelengths, and as illustrated in FIG. 9, (x, y) coordinates of the CIE 1931 color space diagram may be located in the area of a line segment connecting coordinates: (0.4476, 0.4074), (0.3484, 0.3516), (0.3101, 0.3162), (0.3128, 0.3292), and (0.3333, 0.3333). Alternatively, the (x, y) coordinates may be located in the area surrounded by the line segment and the black body radiation spectrum. The color temperature of white light may range from 1,500K to 20,000K.

In FIG. 9, white light near the point E (0.3333, 0.3333) below the blackbody radiation spectrum may be used as a light source for lighting to create clearer viewing conditions for the naked eye in which light having a yellow-based component is reduced. Thus, a lighting product using white light around the point E (0.3333, 0.3333) below the black body radiation spectrum may be usefully employed as a lighting apparatus for, e.g., a retail space in which groceries, clothing, or the like are for sale.

Phosphors that may be used in the white light emitting device are as follows. In the case of a red phosphor, a red nitride phosphor according to the aforementioned exemplary embodiments may be used. In addition, wavelength conversion members 150A and 150B may further include other phosphors such as: yellow and green $Y_3Al_5O_{12}$:Ce, yellow and green $Tb_3Al_5O_{12}$:Ce, and yellow and green $Lu_3Al_5O_{12}$:Ce (oxide-based); yellow and green $(Ba,Sr)_2SiO_4$:Eu and yellow and orange $(Ba,Sr)_3SiO_5$:Ce (silicate-based); and green β-SiAlON:Eu, yellow $La_3Si_6N_{11}$:Ce, and orange α-SiAlON:Eu (nitride-based).

The phosphors may also be replaced by other wavelength conversion materials such as quantum dots. The quantum dots may be mixed with the phosphors or used alone in a certain wavelength band. Each of the quantum dots may include a core (3 to 10 nm), such as CdSe and InP, a shell (0.5 to 2 nm), such as ZnS and ZnSe, and a ligand for stabilizing the core and shell, and may achieve various colors according to their sizes.

Lighting Apparatus Including Red Phosphor

The red phosphor according to an exemplary embodiment of the present disclosure may significantly increase the luminous efficacy of radiation (LER) by reducing the loss region outside of the visible light region, and may be advantageously used in various lighting apparatuses to ensure a high color rendering index (CRI).

Figure 10:
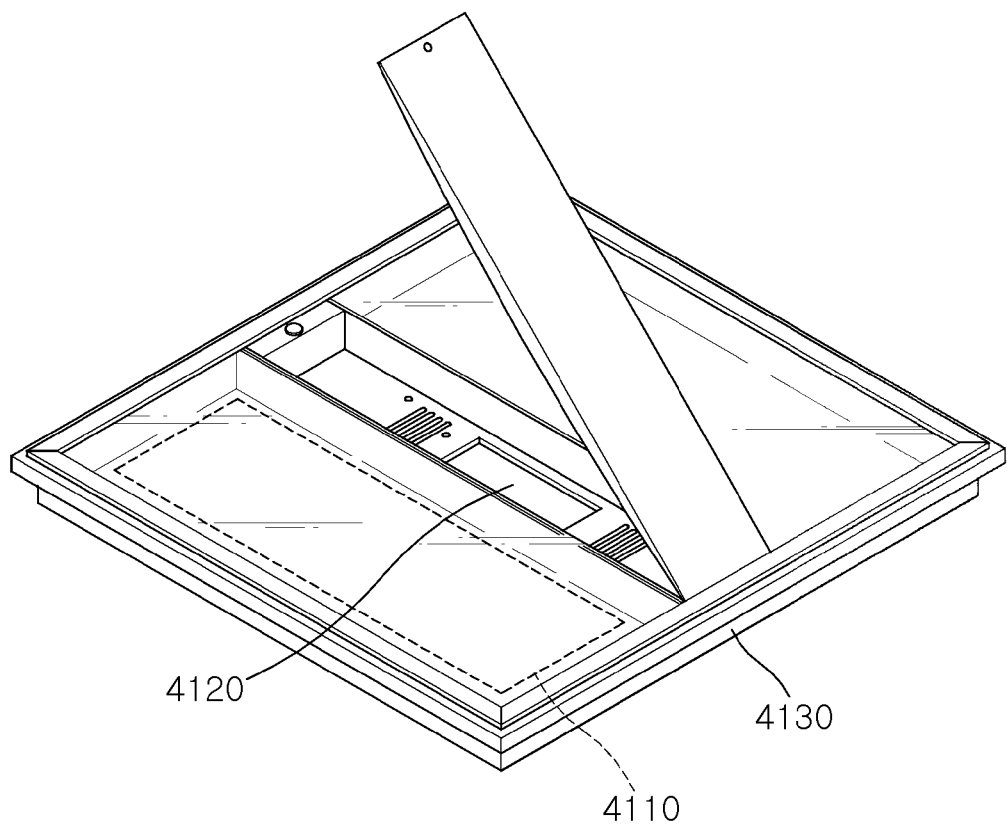
FIG. 10 is a perspective view schematically illustrating a flat lighting apparatus according to an exemplary embodiment of the present disclosure.

FIG. 10 is a perspective view schematically illustrating a flat lighting apparatus according to an exemplary embodiment of the present disclosure.

Referring to FIG. 10, a flat lighting apparatus 4100 may include a light source module 4110, a power supply 4120, and a housing 4130. According to an exemplary embodiment of the present disclosure, the light source module 4110 may include a light source array, and respective light sources used in the light source module 4110 may include a semiconductor light emitting device having a red phosphor according to aforementioned embodiments. For example, the semiconductor light emitting device may be one of the white light emitting devices respectively illustrated in FIGS. 7 and 8. The power supply 4120 may include a light emitting diode (LED) driver.

The light source module 4110 may include the light source array, and may have an overall flat shape. According to an exemplary embodiment, the light source module 4110 may include an LED, and a controller that stores driving information for the LED.

The power supply 4120 may be configured to supply power to the light source module 4110. The housing 4130 may have a housing space configured to receive and hold the light source module 4110 and the power supply 4120 therein, and may have a hexahedral shape with an open surface, but is not limited thereto. The light source module 4110 may be configured to emit light toward the open surface of the housing 4130.

Figure 11:
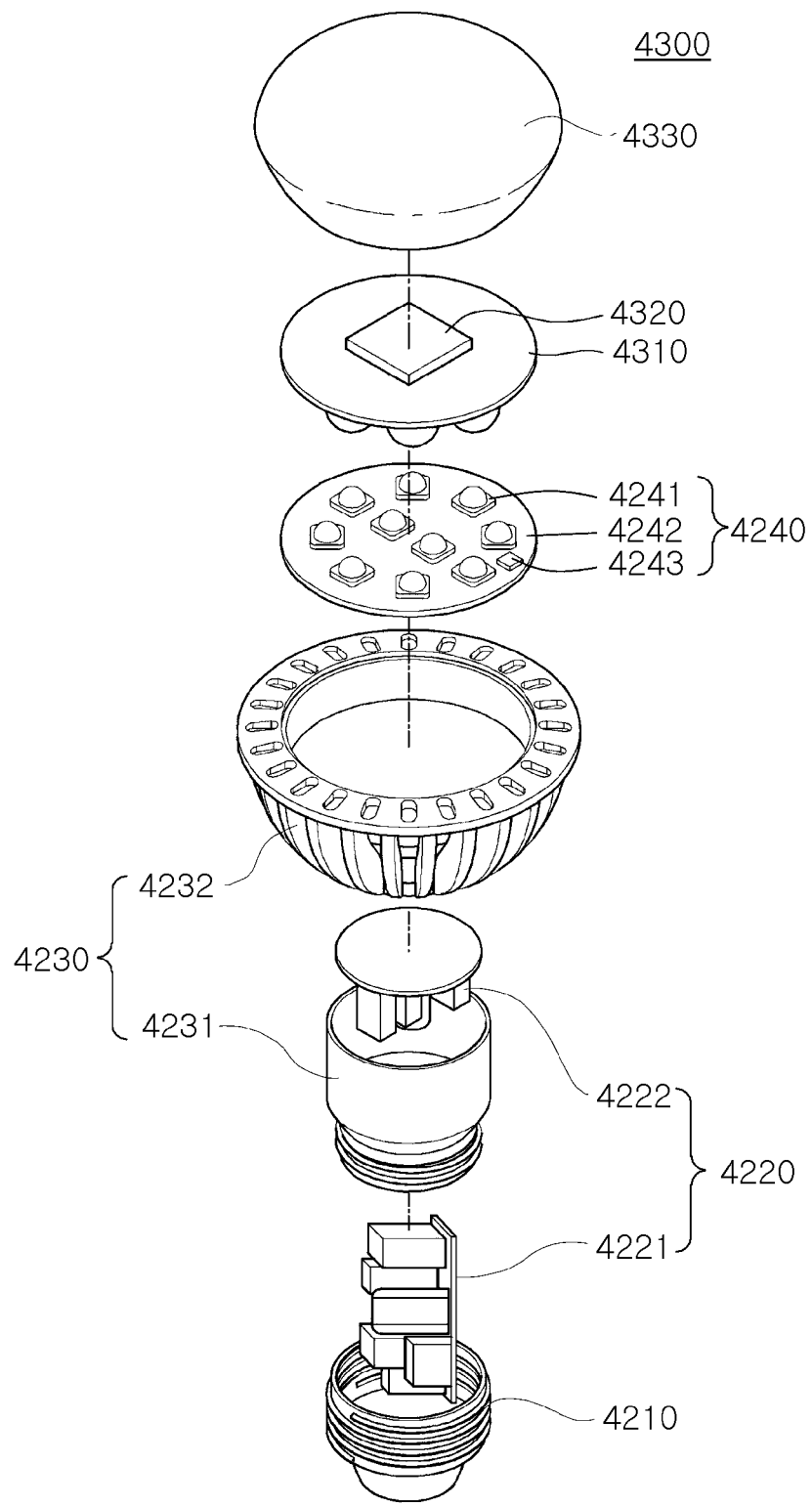
FIG. 11 is an exploded perspective view illustrating a bulb lighting apparatus according to an exemplary embodiment of the present disclosure.

FIG. 11 is an exploded perspective view illustrating a bulb lighting apparatus according to an exemplary embodiment of the present disclosure.

Referring to FIG. 11, a lighting apparatus 4300 may include a socket 4210, a power supply 4220, a heat dissipation portion 4230, a light source module 4240, and an optical portion 4330. According to an example, the light source module 4240 may include an LED array, and the power supply 4220 may include an LED driver.

The socket 4210 may be configured to replace that of a conventional lighting apparatus. Power supplied to the lighting apparatus 4300 may be applied through the socket 4210. As illustrated in FIG. 11, the power supply 4220 may be attached separately to a first power supply unit 4221 and a second power supply unit 4222. The heat dissipation portion 4230 may include an internal heat dissipation portion 4231 and an external heat dissipation portion 4232. The internal heat dissipation portion 4231 may be directly connected to the light source module 4240 and/or the power supply 4220. This may allow heat to be transferred to the external heat dissipation portion 4232. The optical portion 4250 may include an internal optical portion (not shown) and an external optical portion (not shown), and may be configured to evenly diffuse light emitted by the light source module 4240.

The light source module 4240 may receive power from the power supply 4220 to emit light to the optical portion 4250. The light source module 4240 may include at least one light source 4241, a circuit board 4242, and a controller 4243, and the controller 4243 may store driving information for the at least one light source 4241, for example, an LED. The light source 4241 used in the light source module 4240 may be a semiconductor light emitting device having a red phosphor according to aforementioned embodiments. For example, the semiconductor light emitting device may be one of the white light emitting devices respectively illustrated in FIGS. 7 and 8.

The lighting apparatus 4300 according to an exemplary embodiment of the present disclosure may include a reflector 4310 disposed above the light source module 4240, and may reduce glare by evenly diffusing light emitted by the at least one light source 4241 to a side and rear of the reflector 4310.

A communications module 4320 may be mounted on an upper portion of the reflector 4310, and may perform home network communications. For example, the communications module 4320 may a wireless communications module using Zigbee®, Wi-Fi, or Li-Fi, and may control, e.g., the on/off functions and brightness of a lighting apparatus installed in and around the home through a smartphone or wireless controller. Further, use of a Li-Fi communications module using a visible light wavelength of a lighting apparatus installed in and around residential, commercial or industrial spaces may control electronics, such as a TV, a refrigerator, an air-conditioner, a door lock, or may control a vehicle.

The reflector 4310 and the communications module 4320 may be covered with a cover 4330.

Figure 12:
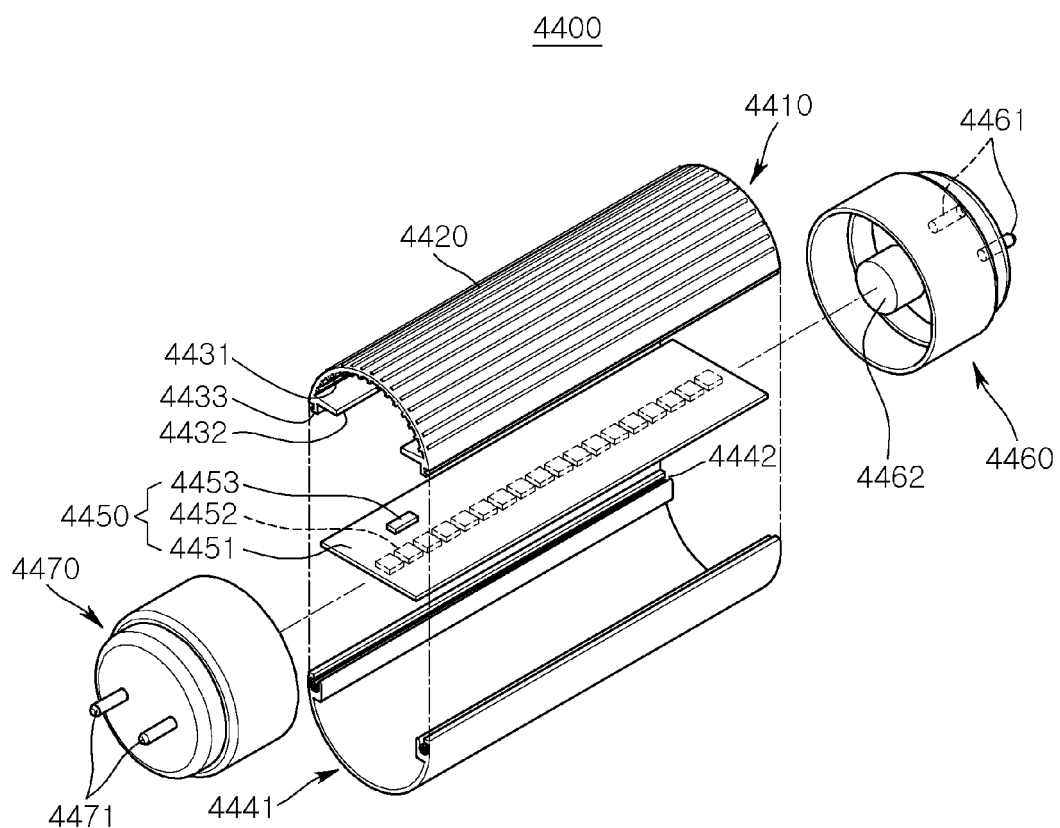
FIG. 12 is an exploded perspective view illustrating a tube lighting apparatus according to an exemplary embodiment of the present disclosure.

FIG. 12 is an exploded perspective view illustrating a tube lighting apparatus according to an example embodiment of the present inventive concept.

A lighting apparatus 4400 illustrated in FIG. 12 may have protrusions 4433 formed on opposing ends of a heat dissipation member 4410. The lighting apparatus 4400 may include the heat dissipation member 4410, a cover 4441, a light source module 4450, a first socket 4460 and a second socket 4470. A plurality of heat dissipation fins 4420 and 4431 may be formed to have an uneven shape on internal or/and external surfaces of the heat dissipation member 4410, and may be designed to have various shapes and intervals. Protruding supports 4432 may be formed on the inside of the heat dissipation member 4410. The light source module 4450 may be fixed to the protruding supports 4432.

Grooves 4442 may be formed in the cover 4441, and the protrusions 4433 of the heat dissipation member 4410 may be coupled to the grooves 4442 by a hooked coupling structure. The locations of the grooves 4442 and the protrusions 4433 may correspond to each other.

The light source module 4450 may include a light emitting device array. The light source module 4450 may include a printed circuit board (PCB) 4451, light sources 4452, and a controller 4453. As described above, the controller 4453 may store driving information for the light sources 4452. The PCB 4451 may have circuit lines formed thereon to operate the light sources 4452, and may also include components for operating the light sources 4452. The light sources 4452 may be semiconductor light emitting devices having a red phosphor according to aforementioned embodiments. For example, a semiconductor light emitting device may be one of the white light emitting devices illustrated in FIGS. 7 and 8.

The first and second sockets 4460 and 4470 may have a structure permitting them to be coupled to both ends of a cylindrical cover unit including the heat dissipation member 4410 and the cover 4441 as a pair of sockets. For example, the first socket 4460 may include electrode terminals 4461 and a power supply 4462, and the second socket 4470 may include dummy terminals 4471 disposed thereon. In addition, one of the first and second sockets 4460 and 4470 may have a built-in optical sensor and/or a communications module. For example, the second socket 4470 with the dummy terminals 4471 disposed thereon may have an optical sensor and/or a communications module built therein. In another embodiment, the first socket 4460 with the electrode terminals 4461 disposed thereon may have a built-in optical sensor and/or a communications module.

The scope of the present disclosure is not limited to the aforementioned embodiments and the accompanying drawings, nor is it limited by the claims recited below. While exemplary embodiments have been illustrated and described above, it will be apparent to those skilled in the art that modifications and variations may be made without departing from the scope of the present disclosure as defined by the appended claims.

As set forth above, according to exemplary embodiments of the present disclosure, the aforementioned red phosphor may significantly increase the luminous efficacy of radiation (LER) by reducing the loss region outside of the visible region. The red phosphor may be widely used in white light emitting devices and light apparatuses, providing superior white light.

What is claimed is:

1. A red phosphor comprising a nitride having a formula of $Sr_xMg_ySi_zN_{2/3(x+y+2z+w)}$:$Eu_w$, wherein x, y, z, and w satisfy the relationships $0.95<x<1$, y is 3, z is 1, $0<w<0.05$, and $x+w=1$,
   wherein the red phosphor is configured to emit emitted light having a peak wavelength in a range of 610 nm to 625 nm when irradiated by an excitation source, wherein the excitation source is a blue light source having a dominant wavelength in a range of 420 nm to 470 nm, and a spectrum of the emitted light has a full-width at half-maximum (FWHM) less than or equal to 55 nm.

2. The red phosphor of claim 1, wherein the red phosphor has an oxygen content of less than or equal to 1 wt %.

3. The red phosphor of claim 1, wherein an amount of light having a wavelength longer than or equal to 680 nm in a spectrum of the emitted light is less than or equal to 5% of a total amount of the emitted light.

\* \* \* \* \*